United States Patent [19]

Okano et al.

[11] 4,431,473
[45] Feb. 14, 1984

[54] RIE APPARATUS UTILIZING A SHIELDED MAGNETRON TO ENHANCE ETCHING

[75] Inventors: Haruo Okano, Yokohama; Yasuhiro Horiike, Tokyo, both of Japan

[73] Assignee: Tokyo Shibaura Denki Kabushiki Kaisha, Tokyo, Japan

[21] Appl. No.: 396,123

[22] Filed: Jul. 7, 1982

Related U.S. Application Data

[63] Continuation-in-part of Ser. No. 324,663, Nov. 24, 1981, abandoned, and Ser. No. 373,162, Apr. 29, 1982.

[30] Foreign Application Priority Data

Jul. 17, 1981 [JP] Japan .................................. 56-110904

[51] Int. Cl.³ ............................................. C23C 15/00
[52] U.S. Cl. .................................... 156/345; 156/643; 204/192 E; 204/298
[58] Field of Search ................. 156/345, 643; 204/298, 204/192 E

[56] References Cited

U.S. PATENT DOCUMENTS

| | | | |
|---|---|---|---|
| 3,981,791 | 9/1976 | Rosvold | 204/298 |
| 4,247,383 | 1/1981 | Greue et al. | 204/298 |
| 4,313,783 | 2/1982 | Davies | 156/345 |
| 4,318,767 | 3/1982 | Hijikata | 156/345 |
| 4,324,631 | 4/1982 | Meckel et al. | 204/298 |
| 4,340,462 | 7/1982 | Koch | 156/345 |
| 4,341,582 | 7/1982 | Kohman et al. | 156/345 |
| 4,352,974 | 10/1982 | Mizutani et al. | 204/192 E |
| 4,367,114 | 1/1983 | Steinberg et al. | 156/345 |
| 4,384,938 | 5/1983 | Desilets et al. | 156/643 |
| 4,388,034 | 6/1983 | Takahashi et al. | 204/298 |

FOREIGN PATENT DOCUMENTS

| | | | |
|---|---|---|---|
| 51-32490 | 3/1976 | Japan | 204/298 |
| 56-87667 | 7/1981 | Japan | 204/298 |

OTHER PUBLICATIONS

Tokuda Seisakusho, Ltd., *Reactive Ion Etching System; TRIE-303*, Kanagawa-Ken, Japan.

*Primary Examiner*—Jerome W. Massie
*Attorney, Agent, or Firm*—Schuyler, Banner, Birch McKie & Beckett

[57] ABSTRACT

A dry etching apparatus for semiconductor wafers has a decompression vessel, the inside of which is divided by a separating wall into a discharge room and a shield room. The discharge room has a pair of elecrodes between which RF electric power is applied. One of the electrodes is placed at the separating wall and supports the wafer which is to be etched. A magnet assembly in the shield room generates a magnetic flux in the discharge room which perpendicularly intersects the electric field between the electrodes. A reactive gas is introduced into the discharge room, however, no discharge occurs, because its pressure is maintained below that required for discharge. This results in a reduced consumption of electric power, less heating, and less damage to the resist mask on the wafer.

12 Claims, 6 Drawing Figures

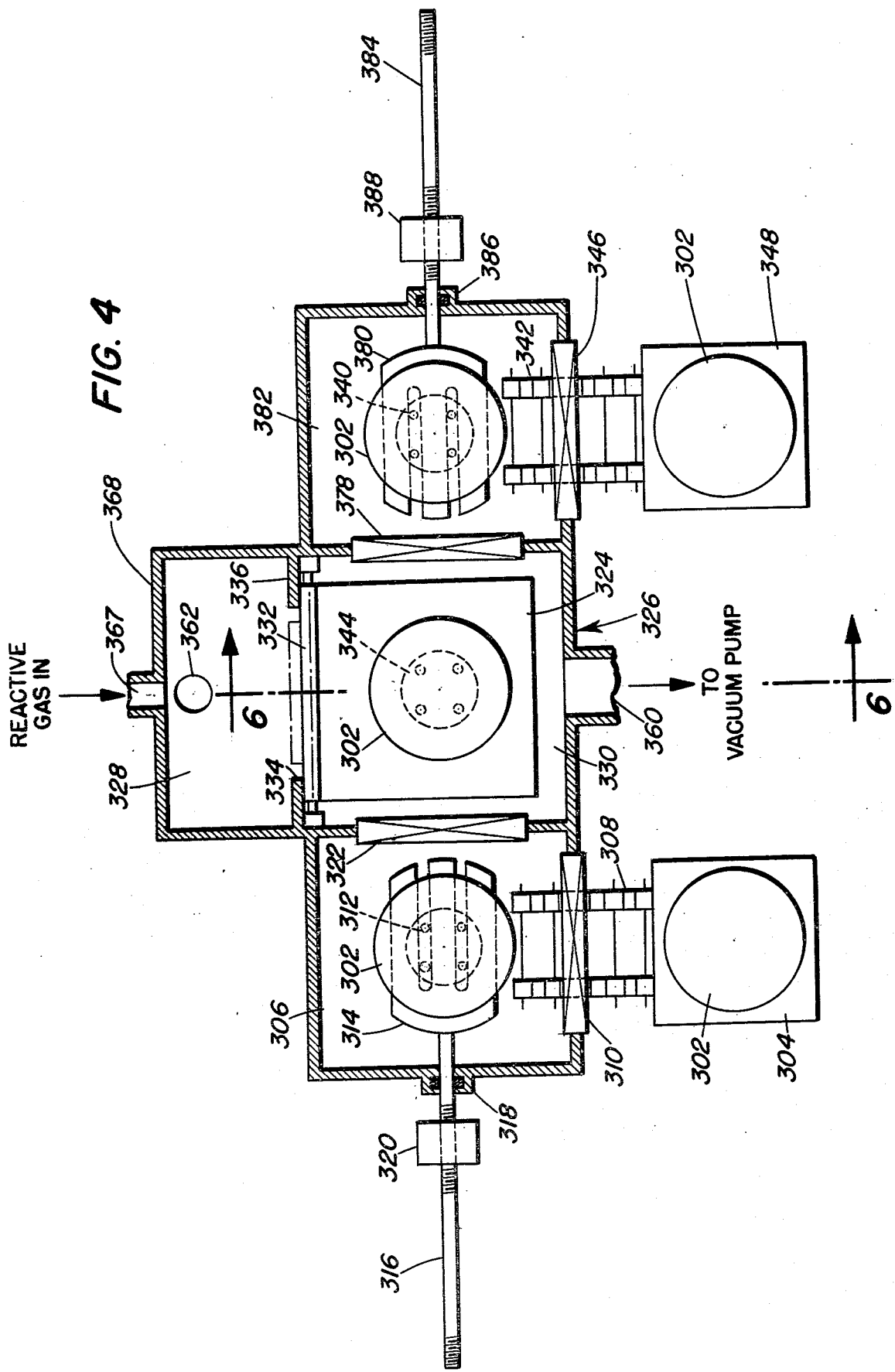

RIE APPARATUS UTILIZING A SHIELDED MAGNETRON TO ENHANCE ETCHING

RELATED APPLICATION

The present application is a continuation-in-part of two copending applications, Ser. No. 324,663, filed on Nov. 24, 1981 now abandoned, and Ser. No. 373,162, filed on Apr. 29, 1982.

BACKGROUND OF THE INVENTION

This invention relates to a high-speed etching apparatus for use in the manufacture of electrical parts such as semiconductor integrated circuits.

The miniaturization of integrated circuits has made such rapid progress in the last few years that recently very large scale integrated circuits (VLSTs) have been developed with dimensions of 1-2 $\mu$m. For such minaturization, a method that has attracted attention is the Reactive Ion Etching method or RIE, wherein a reactive gas, such as $CF_4$ or $CCl_4$, is introduced into a decompression or vacuum vessel having parallel-plate type electrodes; glow discharge is produced by applying radio frequency electric power to the electrodes on one of which the sample to be etched has been placed, and etching is effected by accelerating the positive ions in the plasma by means of the negative DC self-bias (cathode voltage drop) produced at this electrode, irradiating the sample vertically.

In this RIE method, however, when etching $SiO_2$ using $CF_4+H_2$ gas, for example, the etching rate was at most 300-400 A/min, which meant that it took twenty to thirty minutes to etch a 1 $\mu$m $SiO_2$ film. Etching speed was also slow in the case of Al and poly-Si, and the method is ill-adapted for mass production. It is known that increasing the operating current is effective, but this brings with it the danger of an increase in the cathode voltage drop, with the risk of ion damage to the sample and a decrease in the etching selectivity radio, which is the ratio of the etching rate of the layer being etched (such as $SiO_2$) to the etching rate of the substrate (for example, Si). Another limitation was that the resist material used to mask the surface reached a high temperature and became subject to deformation.

The present inventors previously developed a high-speed RIE method for etching monocrystalline Si, $SiO_2$, Al, Mo, W, and poly-Si without any risk of ion damage which is described in full detail in U.S. patent application Ser. No. 324,663, filed on Nov. 24, 1981, by the same inventors as those of the present invention. In this method a magnetron discharge is used for etching by applying a magnetic field perpendicular to the electric field between the parallel electrodes within a reaction chamber in the decompression vessel where a reactive gas, $CF_4$ mixed with $H_2$, is introduced for ionization.

According to the parent applications, an apparatus and method for dry etching are disclosed in which an etchant gas such as $CF_4+H_2$ is introduced into a reaction chamber; high-frequency electric power is applied between the upper wall of the reaction chamber, which acts as an anode, and a cathode of nonmagnetic metal within the reaction chamber. A magnet assembly under the cathode generates a magnetic flux B perpendicular to the electric field E (caused by the cathode voltage drop) in the vicinity of the upper surface of the cathode. Electrons in the electromagnetic field are accelerated by the force E×B so that they are trapped in a drift track and generate a magnetron discharge within the discharge area, near the upper surface of the cathode. A sample to be etched, such as a semiconductor wafer, is placed on the surface of the cathode; and the magnet assembly under the cathode is enclosed in a shield room which is made of insulating material such as "Teflon" in order to prevent any discharging below the cathode. The apparatus enables etching to be done at high rates such as more than 6000 A/min for $SiO_2$. The improved method of application No. 373,162 involves the use of reactive gas molecules which contain atoms of both fluorine and hydrogen, in the same type of apparatus, to improve the etching selectivity ratio. The apparatus, however, has a problem in that the magnetron discharge occurs not only in the discharge area but also in the shield room because the atmosphere inside the shield room communicates with, and is kept in the same condition as, that in the discharge area which is evacuated and supplied with reactive gas at a pressure of about $10^{-4}$ Torr. The discharge in the shield room results in about twice the power consumption as is require to etch the sample. Moreover, the discharge in the shield room heats the cathode and injures the resist material provided as a patterned mask on the sample.

SUMMARY OF THE INVENTION

It is therefore an object of the present invention to provide an improved apparatus for high speed dry etching used in the manufacture of products such as semiconductor devices.

It is another object of the present invention to provide an improved apparatus for high speed dry etching in which electric power consumption is reduced.

It is a further object of the present invention to provide an improved apparatus for high speed dry etching in which an excess temperature rise in the cathode and the accompanying injury of a sample on it are avoided.

It is a specific object of the present invention to provide an apparatus for high speed dry etching in which no discharge occurs in the shield room.

According to the present invention, a decompression vessel has an anode and a cathode to which are applied radio-frequency electric power. The decompression vessel is divided into a discharge room enclosing the electrodes and a shield room enclosing a magnet assembly. The magnet assembly generates a magnetic flux perpendicular to the electric field existing between the electrodes in the discharge room. The shield room is hermetically separated from, and maintained at a lower pressure than, the discharge room, preventing a discharge in the shield room.

BRIEF DESCRIPTION OF THE DRAWINGS

FIGS. 4-6 show another embodiment of the dry etching apparatus according to the present invention; FIG. 4 is a schematic top view of the apparatus; FIG. 5 is a perspective view of a wafer holder shown in FIG. 4; and FIG. 6 is an enlarged schematic sectional view taken along line 6—6 of FIG. 4.

DESCRIPTION OF THE PREFERRED EMBODIMENT

Figure 1:
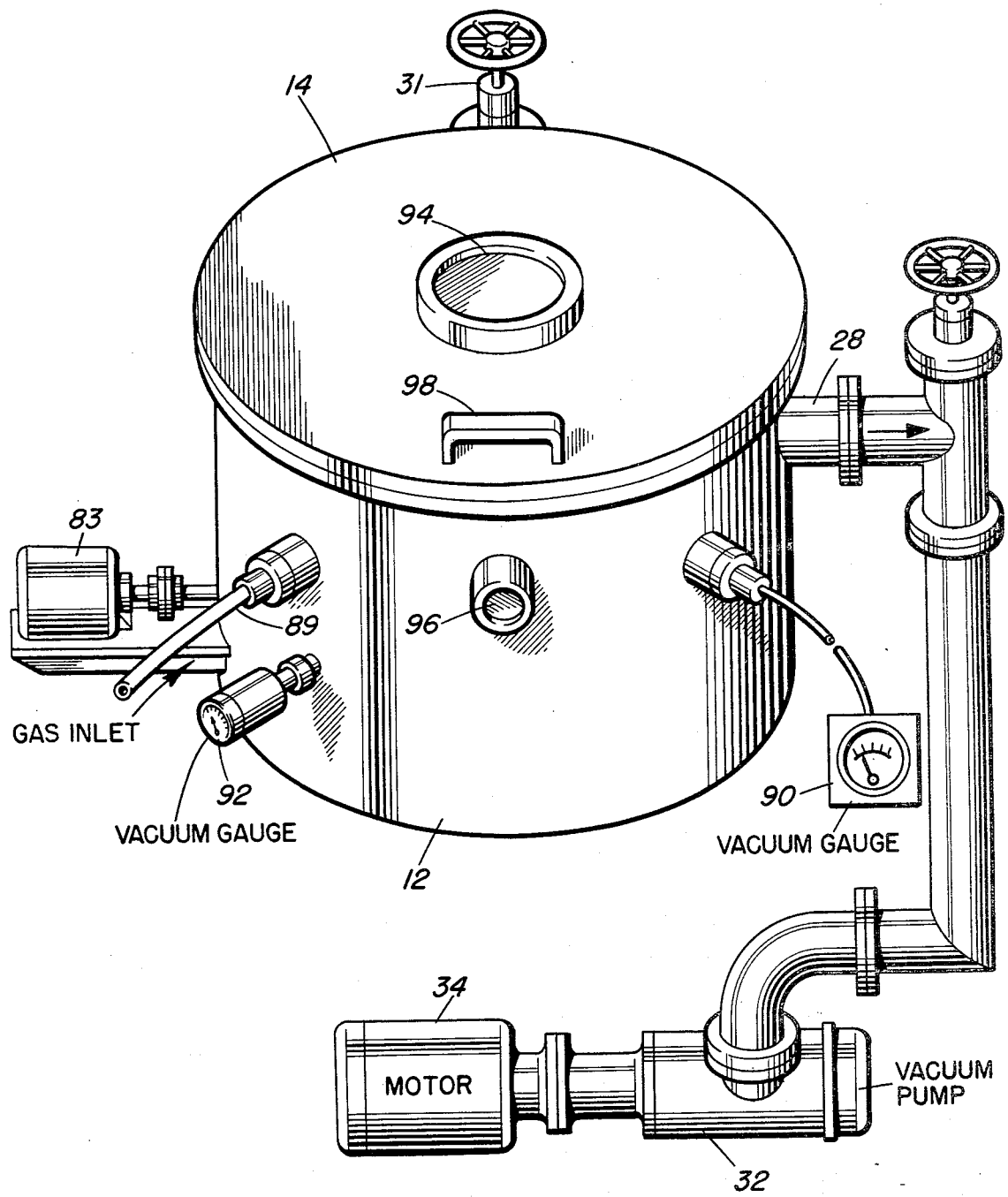
FIG. 1 is a perspective view showing an apparatus for dry etching according to the present invention.
Figure 2:
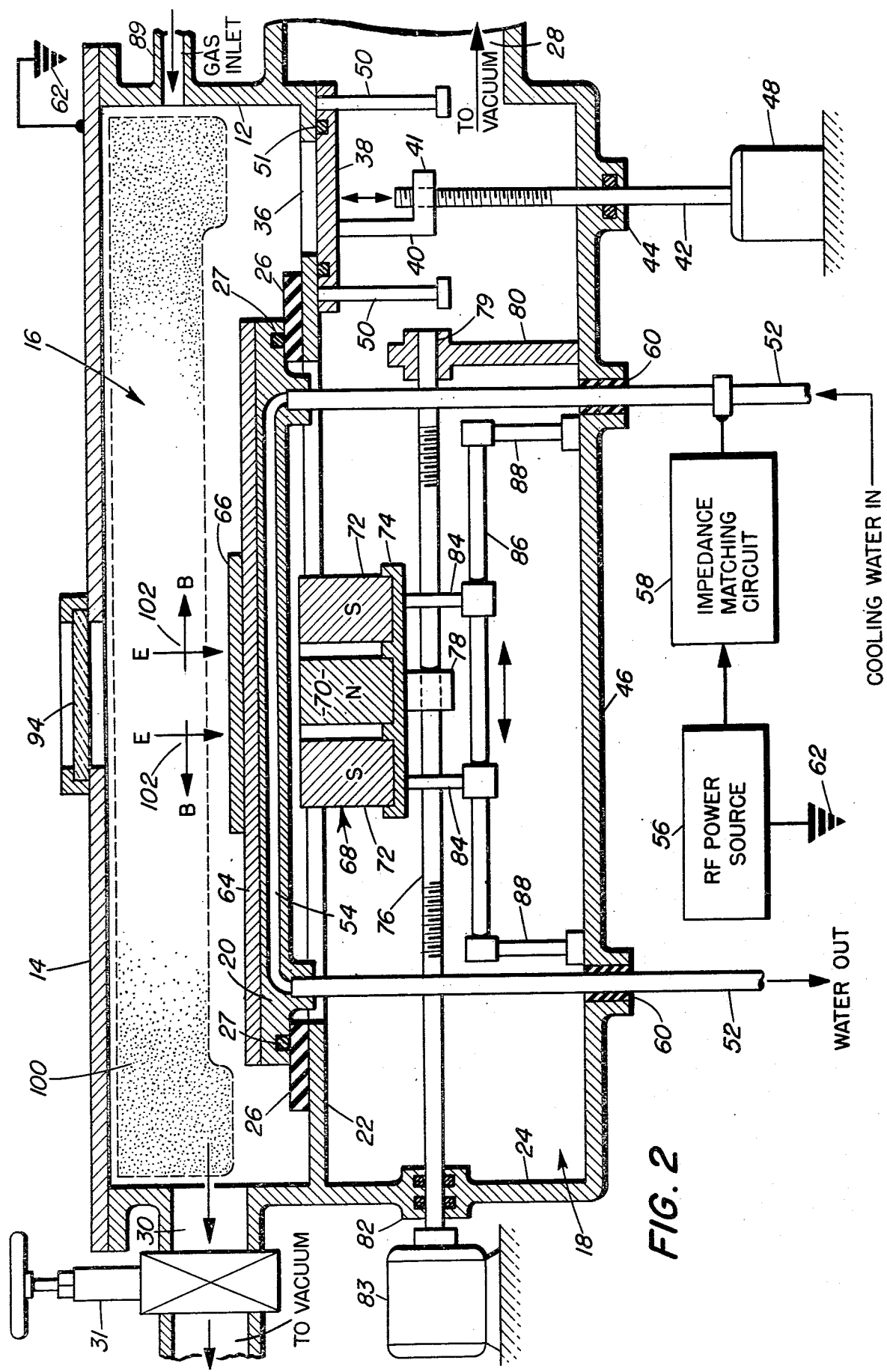
FIG. 2 is a cross-sectional view schematically showing an inner structure of the apparatus shown in FIG. 1.

FIGS. 1 and 2 show a preferred embodiment of a high speed dry etching apparatus according to the present invention. A cylindrical decompression vessel 12, made of stainless steel, has a cover plate 14, also made of stainless steel, which also serves as an anode. Vessel 12 is separated into two rooms, a discharge room 16 and a shield room 18, by a cathode plate 20 which is made of copper and spaced from cover plate (or anode) 14. Cathode plate 20 is supported on a separating wall 22 extending from a side wall 24 toward the center of the vessel.

An insulating ring 26 is placed between cathode plate 20 and separating wall 22 to electrically insulate them. An O-ring between cathode plate 20 and insulating ring 26 provides a hermetic seal at this point between discharge room 16 and shield room 18. Vessel 12 has a first and a second exhaust outlet 28 and 30 in side wall 24. First exhaust outlet 28, the one of larger diameter, communicates with shield room 18 and is connected to an exhaust system including an exhaust pump 32 driven by a driving motor 34. Second exhaust outlet 30, of smaller diameter, communicates with discharge room 16 and is also connected to an exhaust system including an exhaust pump and a driving motor (not shown) through a valve 31. Discharge room 16 has another exhaust outlet 36 in separating wall 22 which is selectively closed by valve 38. Valve 38 has an arm 40 supporting a nut 41 engaged with screw rod 42. Screw rod 42 is rotatably received by a journal 44 in the bottom wall 46 and is rotated by a motor 48. Motor 48 rotates screw rod 42 clockwise or counterclockwise about its axis to move valve 38 back and forth along guide rods 50. Guide rods 50 extend downward from separating wall 22 parallel to screw rod 42. An O-ring 51 on the surface of valve 38 hermetically closes exhaust outlet 36. Electrically conductive pipes supply a coolant, such as water, through conduit network 54 in cathode plate 20 and also apply electrical energy to the cathode from an RF power source 56 through an impedance matching circuit 58. The pipes 52 are connected at one end to the cathode plate 20 and at the other end to a fluid supply source (not shown) outside the decompression vessel 12. The pipes 52 are electrically insulated from the bottom of the vessel 12 by an insulator 60. Matching circuit 56 is also connected to the pipes. The cover plate 14 is electrically connected to ground 62 and forms the anode. On the cathode plate 20 is a non-magnetized carbon plate 64 on which a sample 66 to be etched is mounted.

Figure 3:
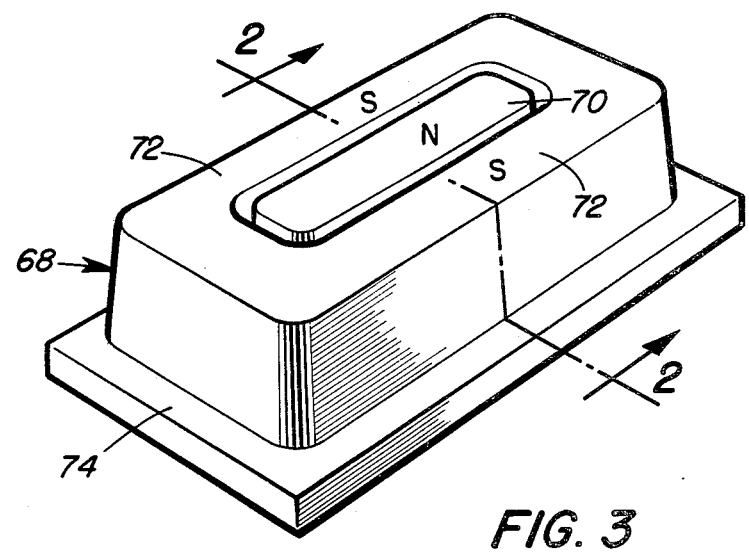
FIG. 3 is a perspective view of a magnet used in the apparatus shown in FIG. 1.

A magnet assembly 68 is installed under the cathode plate 20 in the shield room 18. The assembly 68 comprises, as shown in FIG. 3, first and second samarium-cobalt (Sm-Co) permanent magnets 70 and 72 each having a rectangular cross section, one of which 70 is surrounded by the other one 72. The first and second magnets 70 and 72 are mounted on a ferromagnetic substrate 74 such as soft iron which forms part of a magnet circuit between the first and second permanent magnets. FIG. 2 includes a cross sectional view of these magnets taken along line 2—2 of FIG. 3. As shown in FIG. 2, the magnetic flux B flowing from the north pole of the first magnet 70 into the surrounding south pole of the second magnet 72 is parallel to and the cathode plate 20, within the area between the plates. This area corresponds to the air gap between the first magnet 70 and the second magnet 72. The substrate 74 supporting the magnets 70 and 72 is coupled to a rotating screw rod 76 by a nut 78 fixed on the lower side of the substrate 74. Rod 76 is rotatably received by journals 79, in support arm 80, and 82, in the side wall 24. Screw rod 76 is driven by a motor 83, which alternately rotates the rod 76 clockwise and counterclockwise so that magnets 70 and 72 are scanned (move back and forth) along horizontal screw rod 76. Substrate 74 supporting the magnets 70 and 72 is itself supported by arms 84 guided along a horizontal guide rod 86 which is attached to the bottom wall 46 by arms 88.

A gas inlet 89 on side wall 24 communicates with discharge room 16. There are also in the side wall 24 of the vessel (as shown in FIG. 1) a first and second vacuum gauge 90, 92 for measuring the pressure in discharge room 16 and shield room 18 respectively. A first window 94 in cover 14, and a second window 96 in the side wall of the vessel, are to observe the inside of discharge room 16. A handle 98 is mounted on the cover of the vessel.

The etching process is now explained, with reference to FIG. 2. Motor 48 rotates screw rod 42, lowering valve 38 along guide rods 50 and opening valve 38. Both the discharge room 16 and the shield room 18 are exhausted to less than $10^{-4}$ Torr through exhaust outlet 28 by means of the exhaust system comprising exhaust pump 32 and motor 34 (shown in FIG. 1). At this time, discharge room exhaust outlet 30 is closed by valve 31. Motor 48 then rotates in the opposite direction to close valve 38 and hermetically separate the rooms. A reactive gas, such as $CF_4$ mixed with $H_2$, is introduced into discharge room 16 through gas inlet port 89. At the same time, the discharge room is exhausted to $10^{-1}$ to $10^{-2}$ Torr through exhaust outlet 30 (opened by means of valve 31). Radio-frequency electric power (e.g., 13.56 MHz and about 1.6 $W/cm^2$ power density) is then applied from RF power source 56 to cathode plate 20 through matching circuit 58 and conductive pipe 52. It is also applied to anode plate 14 through ground 62. By applying radio-frequency electric power between the anode and cathode plates, a glow discharge occurs and a plasma 100 fills discharge room 16. The electric field E due to the cathode voltage drop is perpendicular to the surface of the cathode plate 20. At the same time, a magnetron discharge is produced in the area 102 directly above the cathode plate 20 by the orthogonally intersecting electric and magnetic fields $E \times B$. More specifically, because of the crossing electric field and magnetic flux, free electrons in the neighborhood of the magnets begin to move in cycloidal paths and collide with molecules of the introduced reaction gas resulting in a high efficiency of ionization of the gas. This ionization efficiency is about 10-30% which is ten times as high as the efficiency in a conventional glow discharge.

Since the magnetron discharge is generated only in the limited area 102 along the air gap between the first and second magnets, 70 and 72, the magnet assembly 68 is moved to scan the surface of the cathode plate 20. A uniform magnetron discharge is thus generated over the sample 66 mounted on the cathode plate 20. The ionized reactive gas thus generated by the plasma discharge contacts the sample 66 on the cathode plate 17 and performs high-speed etching.

While the discharge occurs in discharge room 16, it is effectively prevented from occurring in shield room 18 since the pressure there is maintained below $10^{31\ 4}$ Torr, a pressure at which discharge cannot occur. As a result, it is possible to achieve the same etching rate as with the device which the inventors have previously developed and explained in detail in their copending patent applications No. 324,663, filed Nov. 24, 1981, and No. 373,162, filed Apr. 29, 1982, but using only half the electrical power. This has been proved by the following experiment conducted by the inventors. In FIG. 2, with valve 38 left open, an etching rate of about 7000 A/min was obtained in etching SiO₂ at 300 W and using a halogen gas, for example, CHF₃ mixed with H₂, at a pressure of $5 \times 10^{-2}$ Torr. With valve 38 closed, however, the same etching rate was obtained at only 150 W, the discharge occurring only in chamber 16 and the etching conditions being otherwise the same. Aside from the matter of the etching rate, because of the decrease in power consumption, heating is also decreased, so that there is substantially no damage at all to the resist which constitutes the mask on the SiO₂.

Figure 5:
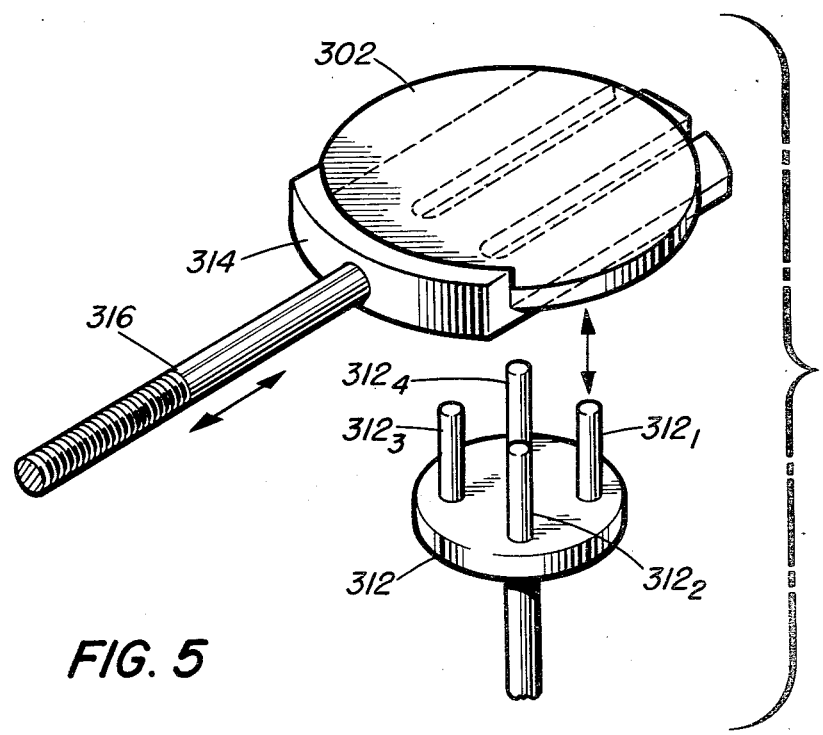
Figure 6:
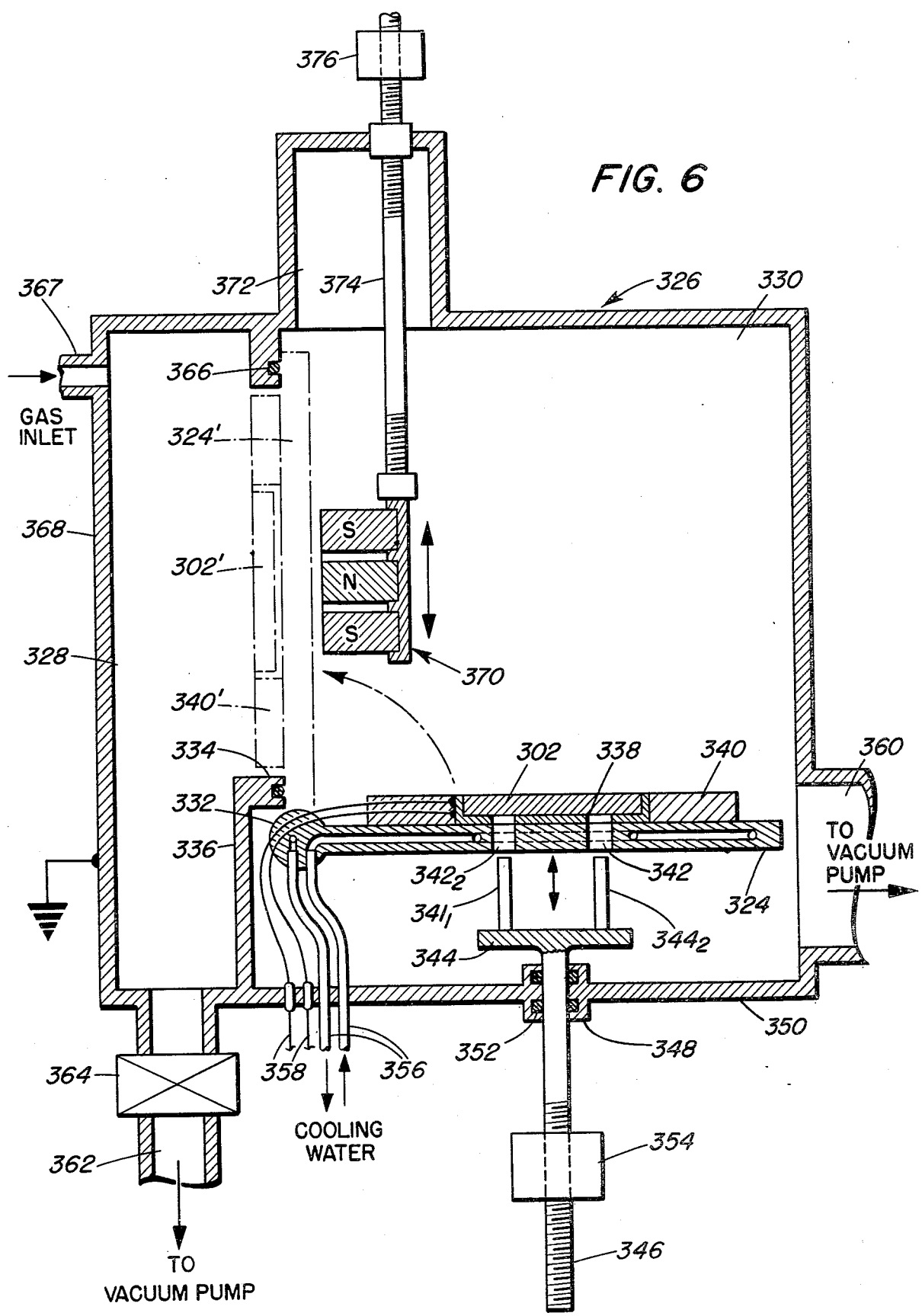

FIGS. 4-6 show another embodiment of the dry etching apparatus according o the invention which makes possible a reduction in size of the apparatus along with the mass-production of etching. Samples such as semiconductor wafers having a diameter of 5-6 inches can be etched according to the present invention with high productivity.

It is therefore not necessary to carry out etching in batches, which require a large etching apparatus. So called "load-lock" types of etching apparatus, in which one or only a few samples are etched at a time, can be used for mass production when designed according to the present invention. The apparatus shown in FIGS. 4-6 is designed according to the invention to etch one wafer at a time using a magnetron discharge. In FIG. 4, a large-diameter semiconductor wafer 302 is received in a cassette 304. Wafer 302 is then transferred from this cassette into a first sub-chamber 306 by a first belt conveyor 308 when a first gate valve 310 of the vacuum chamber is opened. The wafer introduced into the sub-chamber is received by a first pusher 312 which has four upright rods 312₁312₄ and which is placed below a first fork-shaped holder 314. Pusher 312 is then lowered, leaving the wafer on holder 314, as shown in FIG. 5. Holder 314 has a driving rod 316 which extends outside sub-chamber 306 through a journal 318 in a wall of the chamber and is driven by a driving device 320 such as a rotating nut (not shown) engaged with threads formed along driving rod 316. A second gate valve 322 is then opened in response to the movement of holder 314, and the wafer is placed on cathode plate 324 in the decompression vessel 326. More detailed structure of decompression vessel 326 is illustrated in FIG. 6, which is a sectional view taken along line 6—6 of FIG. 4. Decompression vessel 326 has a discharge room 328 and a shield room 330, separated during etching by cathode plate 324. Cathode plate 324 is pivotally supported along one edge by means of a rotary shaft 332 which is supported on the side walls of decompression vessel 326. Cathode plate 324 can be selectively placed in one of two possible positions, that is, an open position and closed position. In the open position it is horizontal in decompression vessel 326 as shown by the solid lines in FIG. 6. In the closed position it is raised upright and closes the opening 334 formed in separating wall 336 as shown by the phantom lines 324' in FIG. 6. At first the cathode plate is opened along with second gate valve 322. Wafer 302 is placed on a thin insulating plate 338 such as a sapphire plate which is firmly fixed on the cathode plate. This insulating plate 338 has an electrode (not shown) so that it can act as an electrostatic chuck to electrostatically hold the wafer on the cathode plate. The cathode plate also has a carbon or quartz ring 340 surrounding the wafer. The cathode plate is provided with holes 342 through which pass upright rods 344₁ to 344₄ of a second pusher 344, to receive the wafer when it is transferred onto the cathode plate by fork-shaped holder 314. Second pusher 344 has a driving rod 346 received by a journal 348 in a bottom wall 350 and extending outside shield room 330. Driving rod 346 is hermetically received in journal 348 by an O-ring 352 made of rubber, for example, and is driven by a driving device 354 which is similar to driving device 320 for the first fork-shaped holder 314. Radio-frequency (RF) electric power is supplied to cathode plate 324 through conduits 356 which at the same time supply cooling fluid in the same way as already mentioned in connection with the apparatus shown in FIG. 2. A pair of electrical conductors 358 are connected to the electrostatic chuck provided on insulating plate 338. These electrical conductors 358 and conduits 356 are flexible to allow them to follow the pivotal movement of the cathode plate. While the cathode is placed in the open position, decompression vessel 326 is exhausted to a pressure of less than $10^{-4}$ Torr through a first exhaust outlet 360. The outlet is connected to an exhaust system similar to that explained in connection with FIG. 1 or 2. During this exhaust period, since a second exhaust outlet 362 of discharge room 328 is closed by a valve 364, both rooms 328 and 330 are exhausted to the same pressure of less than $10^{-4}$ Torr. Cathode plate 324 is then raised to the vertical, as shown by the phantom lines, 324', 302', and 340', by means of the rotatable shaft 332. Discharge room 328 and shield room 330 are thus sealed off from each other by means of O-ring 366 which also serves as an electrical insulator between the cathode plate and separating wall 336. A reactive gas is then introduced through a gas inlet 367 and its pressure is adjusted to a level of $10^{-1}$ to $-10^{-2}$ Torr by exhausting from outlet 362 through valve 364 which is now open. RF power is applied between cathode plate 324' and a side wall 368 which serves also an anode plate. At the same time a magnet assembly 370 extends from a recess 373 in shield room 330 by means of a driving rod 374 and is scanned along (moved parallel to) the surface of the cathode plate by a scanning drive 376 which is similar to the scanning drive 83 in FIG. 2. The magnetron discharge is now generated within the discharge room and etching is done on the surface of the wafer.

After the etching is completed, magnet assembly 370 is retracted into the recess 372 and cathode plate 324 is opened. A third valve 378 in FIG. 4 is also opened. A second fork-shaped holder 380 provided in a second sub-chamber 382 extends into shield room 324 through valve 378 and receives the wafer 302 while it is pushed up by second pusher 344. Then the holder is retracted, with the wafer on it, by a driving rod 384, which is received in a journal 386 in the wall of chamber 382 and is driven by a drive 388 similar to drives 316 and 320 in the first sub-chamber 306. Etched wafer 302 is pushed by a third pusher 340 (which is similar to first and second pushers 314 and 344) onto a second belt conveyor 342 which is similar to first belt conveyor 308. Second belt conveyor 342 conveys the etched wafer through a fourth gate valve 346 in the side wall of second sub-chamber 382 and into a cassette 348 outside the chamber.

According to the embodiment mentioned above, while a discharge is generated in discharge room 328, it will not occur in shield room 330 since the pressure in the shield room is maintained below the pressure at which the discharge occurs. Moreover, since the wafer is etched in a vertical position, dust will not adhere to its surface, an important consideration in the manufacture of micro devices such as integrated semiconductor devices.

Although illustrative embodiments of the present invention have been described in detail with reference to the accompanying drawings, it is to be understood that the invention is not limited to those precise embodiments and that various changes or modifications may be effected therein by one skilled in the art without departing from the scope or spirit of the invention.

We claim:

1. An apparatus for etching a sample by generating a discharge in a reactive gas, said apparatus comprising:
   a decompression vessel;
   separating means within said decompression vessel for hermetically dividing the interior of said vessel into a shield room and a discharge room;
   a pair of spaced electrodes within said discharge room including an anode and a cathode, said cathode supporting the sample;
   electrical power supply means connected to said electrodes for generating an electric field between said electrodes;
   a magnet in the shield room positioned to produce a magnetic flux perpendicular to the electric field;
   gas supply means communicating with said discharge room for introducing the reactive gas into said discharge room; and
   exhaust means communicating with said shield room and said discharge room for reducing the pressure in said discharge room to a first value at which a discharge occurs and reducing the pressure in said shield room to a second value at which a discharge does not occur.

2. An apparatus as claimed in claim 1 wherein said second value is lower than said first value.

3. An apparatus as claimed in claim 2, wherein said separating means comprises a wall having an opening, and said apparatus further comprises a valve selectively operable to hermetically seal said opening.

4. An apparatus as claimed in claim 2 or 3, wherein said decompression vessel has a first exhaust port through which said exhaust means communicates with said shield room, said decompression vessel also having a second exhaust port through which said exhaust means communicates with said discharge room.

5. An apparatus as claimed in claim 4 wherein said exhaust means comprises a primary exhaust system connected to said decompression vessel at said first exhaust port and a secondary exhaust system connected to said decompression vessel at said second exhaust port.

6. An apparatus as claimed in claim 5 wherein said second value is less than $10^{-4}$ Torr.

7. An apparatus as claimed in claim 2 wherein said anode comprises a cover for said decompression vessel.

8. An apparatus for etching a sample by generating a discharge in a reactive gas, said apparatus comprising:
   a decompression vessel;
   a wall within said decompression vessel to separate the interior of said vessel into a shield room and a discharge room, said wall having an opening;
   a pair of spaced electrodes within said discharge room including an anode and a cathode, said cathode supporting the sample and being movable to hermetically seal said opening;
   electrical power supply means connected to said electrodes for generating an electric field between said electrodes;
   a magnet in the shield room positioned to produce a magnetic flux perpendicular to the electric field;
   gas supply means communicating with said discharge room for introducing the reactive gas into said discharge room; and
   exhaust means communicating with said shield room and said discharge room for reducing the pressure in said discharge room to a first value at which a discharge occurs and reducing the pressure in said shield room to a second value at which a disharge does not occur.

9. An apparatus as claimed in claim 8 wherein said cathode is pivotally supported in said vessel.

10. An apparatus as claimed in claim 9 further comprising an electrostatic chuck on said cathode to support the sample.

11. An apparatus as claimed in claim 8 or 9 further comprising:
    a sub-chamber having a first aperture connected to said decompression vessel and a second aperture to the atmosphere;
    first valve means for opening and closing said first aperture;
    second valve means for opening and closing said second aperture; and
    a holder in said sub-chamber to receive the sample through said first aperture and to transfer the sample to said cathode through said second aperture.

12. An apparatus as claimed in claim 11 further comprising:
    a second sub-chamber having a third aperture connected to said decompression vessel and a fourth aperture to the atmosphere;
    third valve means for opening and closing said third aperture;
    fourth valve means for opening and closing said fourth aperture; and
    a holder in said second sub-chamber to transfer the sample from said cathode through said third aperture into said second sub-chamber, from which the sample may be removed through said fourth aperture.

* * * * *